United States Patent
Liu et al.

(10) Patent No.: US 7,233,026 B2
(45) Date of Patent: Jun. 19, 2007

(54) LIGHT EXTRACTION FROM COLOR CHANGING MEDIUM LAYERS IN ORGANIC LIGHT EMITTING DIODE DEVICES

(75) Inventors: Yachin Liu, Poughkeepsie, NY (US); Amalkumar P. Ghosh, Poughkeepsie, NY (US)

(73) Assignee: Emagin Corporation, Hopewell Junction, NY (US)

( * ) Notice: Subject to any disclaimer, the term of this patent is extended or adjusted under 35 U.S.C. 154(b) by 486 days.

(21) Appl. No.: 09/814,853

(22) Filed: Mar. 23, 2001

(65) Prior Publication Data

US 2001/0026124 A1    Oct. 4, 2001

Related U.S. Application Data

(60) Provisional application No. 60/191,470, filed on Mar. 23, 2000.

(51) Int. Cl.
*H01L 29/18* (2006.01)
*H01L 33/00* (2006.01)

(52) U.S. Cl. .............................. 257/88; 257/88; 257/79

(58) Field of Classification Search ........ 313/503–504, 313/506, 509, 512; 257/82, 88, 89; 438/28, 438/FOR. 287, FOR. 416
See application file for complete search history.

(56) References Cited

U.S. PATENT DOCUMENTS

| | | | |
|---|---|---|---|
| 4,885,211 A | 12/1989 | Tang et al. | |
| 5,247,226 A | 9/1993 | Sato et al. | |
| 5,409,783 A | 4/1995 | Tang et al. | |
| 5,458,977 A | 10/1995 | Hosokawa et al. | |
| 5,500,568 A | 3/1996 | Nakamura et al. | |
| 5,503,910 A | 4/1996 | Matsuura et al. | |
| 5,516,577 A | 5/1996 | Matsuura et al. | |
| 5,536,949 A | 7/1996 | Hosokawa et al. | |
| 5,703,436 A | 12/1997 | Forrest et al. | |
| 5,773,929 A | 6/1998 | Shi et al. | |
| 5,811,929 A | 9/1998 | Potter | |
| 5,895,932 A * | 4/1999 | Bojarczuk et al. | 257/102 |
| 5,955,837 A * | 9/1999 | Horikx et al. | 313/489 |
| 6,016,033 A * | 1/2000 | Jones et al. | 313/506 |
| 6,019,654 A * | 2/2000 | Kim | 445/24 |
| 6,137,459 A * | 10/2000 | Eida et al. | 313/501 |
| 6,306,559 B1 * | 10/2001 | Tanamura et al. | 313/504 |
| 6,700,322 B1 * | 3/2004 | Duggal et al. | 313/504 |

* cited by examiner

*Primary Examiner*—Zandra V. Smith
*Assistant Examiner*—Thanh Y. Tran
(74) *Attorney, Agent, or Firm*—Robert L. Epstein; Epstein Drangel Bazerman & James LLP

(57) ABSTRACT

A method of reducing the internal reflected light in an OLED device comprising the step of either scattering light emitted from the OLED or removing light emitted from the OLED. An OLED device comprising a color changing medium film, a transparent substrate, and either a means for scattering light emitted from the OLED or a means for removing light emitted from the OLED such that the internal reflected light is reduced.

10 Claims, 4 Drawing Sheets

LIGHT EXTRACTION FROM COLOR CHANGING MEDIUM LAYERS IN ORGANIC LIGHT EMITTING DIODE DEVICES

CROSS-REFERENCE TO RELATED APPLICATIONS

This application relates to and claims priority on U.S. Provisional Application Ser. No. 60/191,470, filed Mar. 23, 2000 and entitled "Light Extraction from Color Changing Medium Layers in Organic Light Emitting Diode Devices."

FIELD OF THE INVENTION

The invention relates to organic light emitting diode ("OLED") devices. More specifically the present invention relates to a method and apparatus to reduce internal reflection of light in OLEDs.

BACKGROUND OF THE INVENTION

OLEDs have been known for approximately two decades. All OLEDs work on the same general principles. One or more layers of semiconducting organic material is sandwiched between two electrodes. An electric current is applied to the device, causing negatively charged electrons to move into the organic material(s) from the cathode. Positive charge, typically referred to as holes, moves from the anode. The positive and negative charges meet in the center layers (i.e., the semiconducting organic material), combine, and produce photons. The wave-length—and consequently the color—of the photons depends on the electronic properties of the organic material in which the photons are generated.

Light emitting devices, which may be generally classified as organic or inorganic, are well known in the graphic display and imaging art. Among the benefits of organic light emitting devices are high visibility due to self-emission, as well as superior impact resistance, and ease of handling of the solid state devices. Organic light emitting devices may have practical application for television and graphic displays, as well as in digital printing applications.

An OLED is a thin film structure formed on a substrate. A light emitting layer of a luminescent organic solid, as well as adjacent semiconductor layers, are sandwiched between a cathode and an anode. The light emitting layer may consist of multiple sublayers. When a potential difference is applied across the device, negatively charged electrons move from the cathode to the electron-injecting layer and finally into the layer(s) of organic material. At the same time, positive charges, typically referred to as holes, move from the anode to the hole-injection layer and finally into the same light emitting organic layer. When the positive and negative charges meet in the organic material layer(s), they recombine and produce photons. The wave length—and consequently the color—of the photons depends on the electronic properties of the organic material in which he photons are generated.

In a typical matrix-addressed OLED device, numerous OLEDs are formed on a single substrate and arranged in groups in a grid pattern. Several OLED groups forming a column of the grid may share a common cathode, or cathode line. Several OLED groups forming a row of the grid may share a common anode, or anode line. The individual OLEDs in a given group emit light when their cathode line and anode line are activated at the same time.

Fabrication of color displays generally requires side-by-side patterning of red, green and blue ("RGB") sub-pixels. Since the OLED devices are extremely moisture sensitive, any type of wet processing is normally not possible. Moreover, suitable red, blue and green color emitter materials, with good color gamut and lifetime, have not yet been realized. As such, most color OLED displays are fabricated using either color filters or color changing media ("CCM").

A problem arises in the case of CCM materials, wherein, the emitted fluorescent light can be trapped inside the CCM film as well as the transparent substrate on which the CCM film is deposited. This problem is due to the effect of total internal reflection (wave-guiding effect), which is significant if the angle of incidence exceeds the critical angle for that material. The effect is observed when the light exits out of a medium with a higher index of refraction and enters a medium with a lower index of refraction. This situation is identical to the case of a CCM coating over a glass substrate. As a result of light trapping the total amount of useful light (fluorescent) obtained from the CCM material is vastly reduced. FIG. 1 shows an example of light trapping effect.

SUMMARY OF THE INVENTION

In response to the foregoing challenge, Applicants have developed an innovative, economical method of reducing the internal reflection of light in an OLED device, comprising the steps of: providing an OLED device, wherein the OLED device comprises a transparent substrate and a color changing media film; introducing a plurality of transparent particles into the color changing media film; emitting light from the color changing media film; and scattering the light emitted from the color changing media film.

The step of introducing a plurality of transparent particles may comprise introducing a plurality of glass particles, a plurality of fused silica particles, or a combination of both, or any other suitable material, including, but not limited to, dielectric particles.

In an alternative embodiment of the present invention, Applicants have developed a method of reducing the internal reflection of light in an OLED device, comprising the steps of: providing an OLED device, wherein the OLED device comprises a transparent substrate, a color changing media film, and a means for removing a portion of light emitted from the color changing media film; emitting light from the color changing media film; and removing a portion of emitted light with the means for removing a portion of light emitted from the color changing media film.

In an alternative embodiment of the present invention, Applicants have developed a method of reducing the internal reflection of light in an OLED device, comprising the steps of: providing a transparent substrate; roughening the transparent substrate; providing an OLED device, wherein the OLED device comprises the roughened transparent substrate and a color changing media film; emitting light from the color changing media film; and scattering the light emitted from the color changing media film.

The step of roughening the transparent substrate may comprise mechanically roughening the transparent substrate, sand-blasting the transparent substrate, or roughening the substrate by any other suitable mechanical or non-mechanical means.

In an alternative embodiment of the present invention, Applicants have developed a method of reducing the internal reflection of light in an OLED device, comprising the steps of: providing an OLED device, wherein the OLED device comprises a transparent substrate and a color changing media film; printing at least one photoresist pattern on at least one side of the transparent substrate. The step of printing the at least one photoresist pattern on the at least one side of the transparent substrate may comprise the step of using a laser interference lithograph to print the at least one photoresist pattern on the at least one side of the transparent substrate, or printing at least one high resolution, high density photoresist pattern on at least one side of the transparent substrate, or by any other suitable means.

The step of printing at least one high resolution, high density photoresist pattern on at least one side of the transparent substrate may further comprise printing at least one highly uniform photoresist pattern on at least one side of the transparent substrate. Uniformity of the resist pattern may be preferable as it contributes to the uniformity of the display image. The method may further comprise the step of transferring the at least one photoresist pattern on at least one side of the transparent substrate to an another layer. The step of transferring that at least one photoresist pattern on at least one side of the transparent substrate to an another layer may comprise transferring the at least one photoresist pattern on at least one side of the transparent substrate to an oxide layer, or a layer of any other suitable material.

In an alternative embodiment of the present invention, Applicants have developed an OLED device having a reduced amount of internal reflected light, which comprises: an OLED device, wherein the OLED device comprises a transparent substrate and a color changing media film, wherein the color changing media film comprises a plurality of transparent particles. The plurality of transparent particles may comprise a plurality of glass particles, a plurality of fused silica particles, or a combination of both, or any other suitable material, including, but not limited to, dielectric particles. Other transparent dielectric particles may also be used. Fused silica is most commonly used for such applications. Particles of different materials may be used singularly, or in combination.

In an alternative embodiment of the present invention, Applicants have developed an OLED device having a reduced amount of internal reflected light, which comprises: an OLED device, wherein the OLED device comprises a transparent substrate and a color changing media film; and means for removing a portion of emitted fluorescent light. The means for removing a portion of emitted fluorescent light may comprise a micro-cavity structure.

In an alternative embodiment of the present invention, Applicants have developed an OLED device having a reduced amount of internal reflected light, which comprises: an OLED device, wherein the OLED device comprises a transparent substrate and a color changing media film, wherein the transparent substrate comprises a roughened transparent substrate. The roughened transparent substrate may comprise a mechanically roughened transparent substrate, sand-blasting the transparent substrate, or roughening the substrate by any other suitable mechanical or non-mechanical means.

In an alternative embodiment of the present invention, Applicants have developed an OLED device having a reduced amount of internal reflected light, which comprises: an OLED device, wherein the OLED device comprises a transparent substrate and a color changing media film, wherein the transparent substrate comprises at least one photoresist pattern printed on at least one side of the transparent substrate. The at least one photoresist pattern printed on at least one side of the transparent substrate may be printed using a laser interference lithography, or may comprise at least one high resolution, high density photoresist pattern printed on at least one side of the transparent substrate. The at least one high resolution, high density photoresist pattern printed on at least one side of the transparent substrate may comprise at least one highly uniform photoresist pattern. The at least one photoresist pattern printed on at least one side of the transparent substrate may be transferred to an another layer. The another layer may be an oxide layer, or a layer composed of any other suitable material.

It is to be understood that both the foregoing general description and the following detailed description are exemplary and explanatory only, and are not restrictive of the invention as claimed. The accompanying drawings, which are incorporated herein by reference, and which constitute a part of this specification, illustrate certain embodiments of the invention, and together with the detailed description serve to explain the principles of the present invention.

OBJECTS OF THE INVENTION

It is therefore an object of the present invention to overcome the above-identified shortcomings of the prior art.

It is another object of the present invention to provide a suitable method to reduce total internal light reflection in an OLED device.

It is a further object of the present invention to provide increased extraction of light in an OLED device.

It is still another object of the present invention to provide increased extraction of light with higher efficiency in an OLED device.

Additional objects and advantages of the invention are set forth, in part, in the description which follows and, in part, will be apparent to one of ordinary skill in the art from the description and/or from the practice of the invention.

DETAILED DESCRIPTION OF THE PREFERRED EMBODIMENTS

Figure 4:
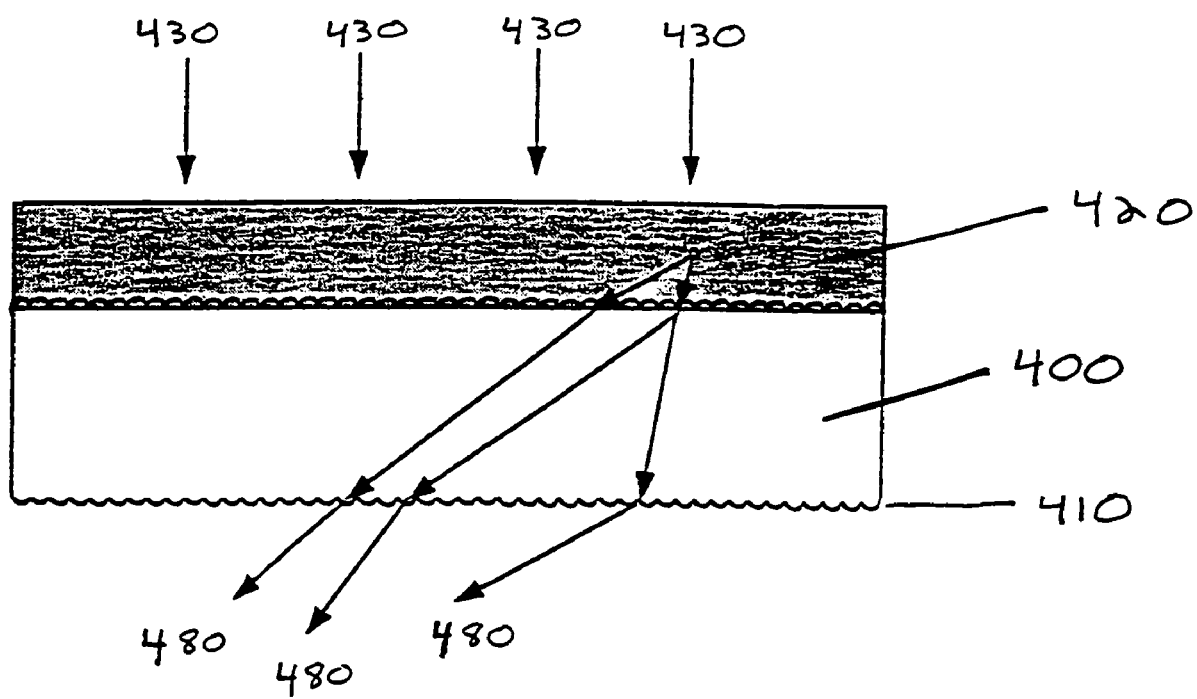
FIG. 4 is a schematic view of another embodiment of the present invention illustrating a reduction in internal light reflection achieved by mechanically roughening the transparent substrate.

Reference will now be made in detail to the preferred embodiments of the present invention, examples of which are illustrated in the accompanying drawings. A preferred method of the present invention is illustrated by FIG. 4.

Figure 1:
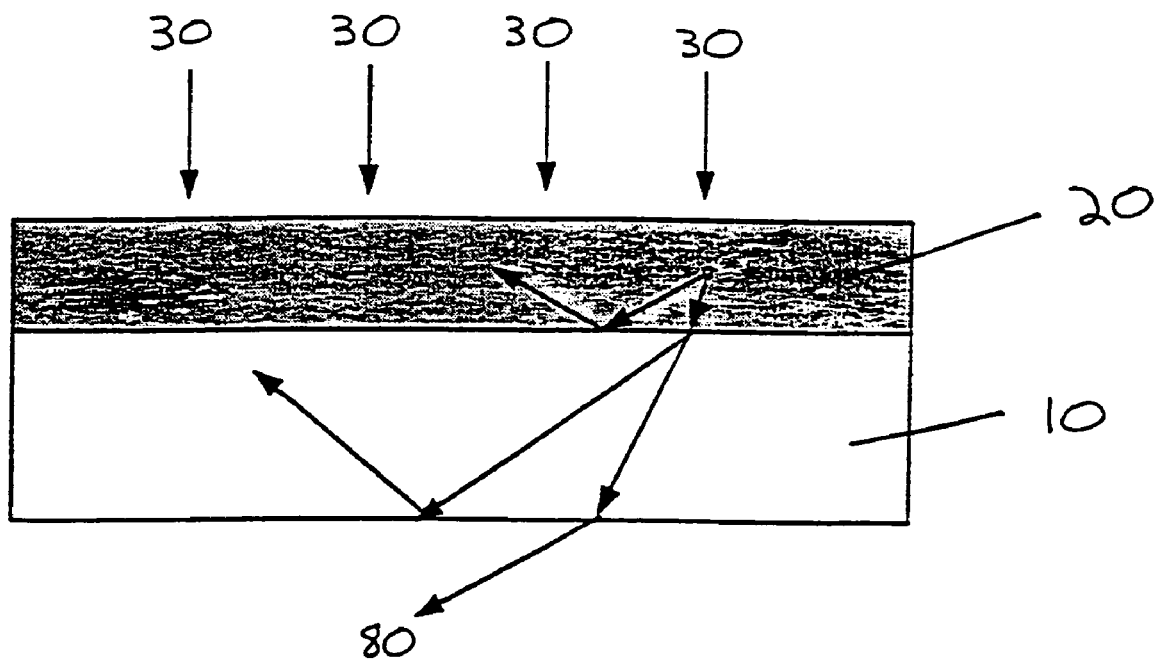
FIG. 1 is a schematic view of an OLED device exhibiting a light trapping effect.

FIG. 1 illustrates the problem of internal reflected light in OLED displays fabricated using color changing media film. Emitted light 30 from the OLED enters the color changing media film 20. The emitted light 30 passes through the color changing media film 20 towards the transparent substrate 10 on which the color changing media film 20 is deposited. The problem of emitted light 30 reflecting as it passes from the color changing media film 20 to the transparent substrate 10 is significant if the angle of incidence exceeds the critical angle for the color changing media film 20. The effect is observed when the emitted light 30 exits out the color changing media film 20 (a medium with a higher index of refraction) and enters the transparent substrate 10 (a medium with a lower index of refraction). As a result of internal light trapping the total amount of useful light 80 obtained from the color changing media film 20 is vastly reduced.

Total internal light reflection can be reduced by various methods and the light can be extracted out of the color changing media film and the substrate with higher efficiency as shown by various embodiments of the present invention.

Figure 2:
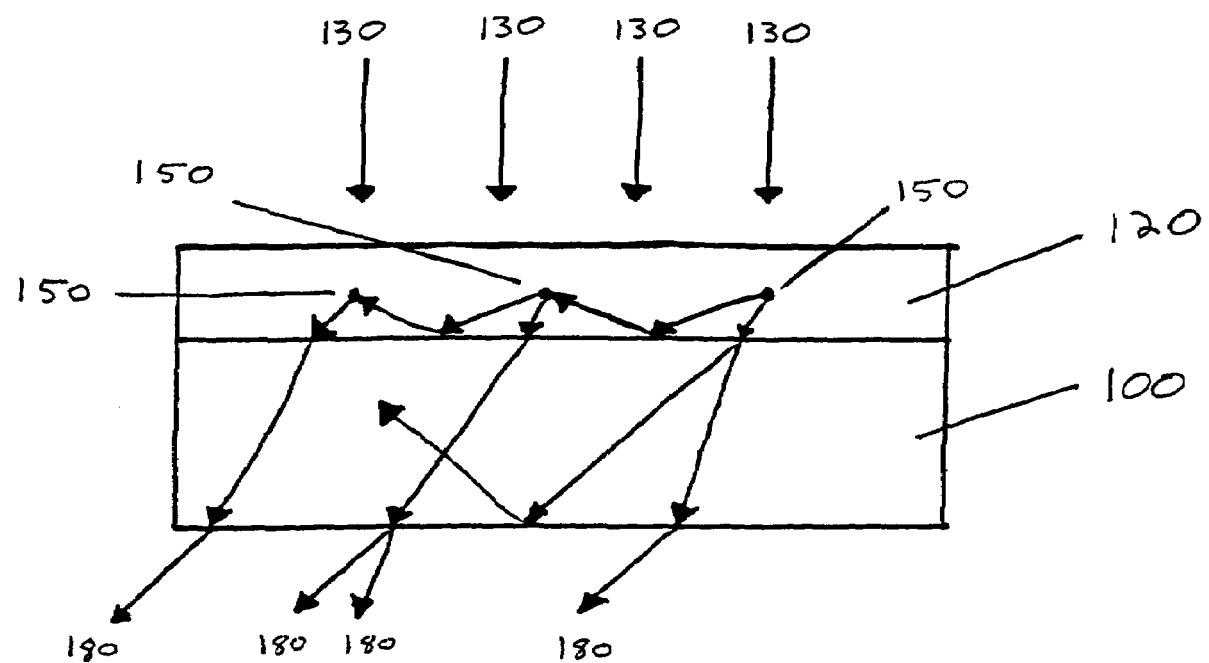
FIG. 2 is a schematic view of an embodiment of the present invention illustrating a reduction in internal light reflection achieved by introducing a plurality of transparent particles into the color changing media film.

FIG. 2 illustrates one embodiment of the present invention. Very fine transparent particles 150 are introduced in the color changing media film 120. These particles may be on the order of, but are not limited to, one micron or less in size. Emitted light 130 from the OLED enters the color changing media film 120 and is scattered in various directions by the transparent particles 150 as it passes through the color changing media film 120. The scattering of emitted light 130 reduces the angle of incidence for much of the emitted light 130 such that the angle of incidence does not exceed the critical angle for the color changing media film 120 and allows that emitted light 130 to pass through to the transparent substrate 100. As a result of reducing the internal light that becomes trapped, the total amount of useful light 180 is greatly increased. The fine transparent particles 150 may comprise, but are not limited to, glass or fused silica particles.

Figure 3:
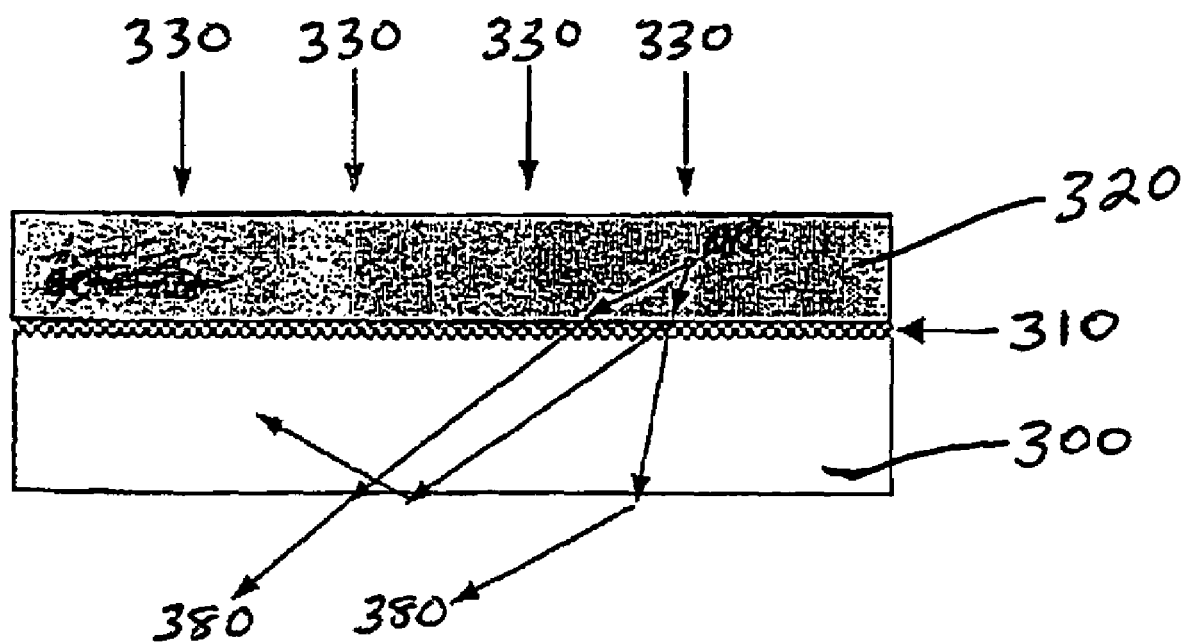
FIG. 3 is a schematic view of another embodiment of the present invention illustrating a reduction in internal light reflection achieved by mechanically roughening the transparent substrate.

FIG. 3 illustrates another embodiment of the present invention. The surface of the transparent substrate 300 is finely roughened. The finely roughened surface 310 may be formed by sand-blasting the transparent substrate 300 or other mechanical processes, however, non-mechanical processes for forming the finely roughened surface 310 of the transparent substrate 300 are also contemplated under the present invention. Emitted light 330 from the OLED enters the color changing media film 320. The emitted light 330 passes through the color changing media film 320 towards the transparent substrate 300 on which the color changing media film 320 is deposited. The emitted light 330 is scattered in various directions by the finely roughened surface 310 of the transparent substrate 300. The scattering of emitted light 330 reduces the angle of incidence for much of the emitted light 330 such that the angle of incidence does not exceed the critical angle for the color changing media film 320 and allows that emitted light 330 to pass through to the transparent substrate 300. As a result of reducing the internal light that becomes trapped, the total amount of useful light 380 is greatly increased.

FIG. 4 illustrates a preferred embodiment of the present invention. The surface of the transparent substrate 400 is finely roughened. The finely roughened surface 410 may be formed by laser interference lithography, however, other processes for forming the finely roughened surface 410 of the transparent substrate 400 are also contemplated under the present invention. The process of laser interference lithography allows one to print photoresist patterns of very high resolution (as high as ~0.1 µm feature size) with extremely high density (each feature can be arranged to touch all the neighboring features). Emitted light 430 from the OLED enters the color changing media film 420. The emitted light 430 passes through the color changing media film 420 towards the transparent substrate 400 on which the color changing media film 420 is deposited. The emitted light 430 is scattered in various directions by the finely roughened surface 410 of the transparent substrate 400. The scattering of emitted light 430 reduces the angle of incidence for much of the emitted light 430 such that the angle of incidence does not exceed the critical angle for the color changing media film 420 and allows that emitted light 430 to pass through to the transparent substrate 400. As a result of reducing the internal light that becomes trapped, the total amount of useful light 480 is greatly increased.

It is to be understood that both the foregoing general description and the following detailed description are exemplary and explanatory only, and are not restrictive of the invention as claimed. The accompanying drawings, which are incorporated herein by reference, and which constitute a part of this specification, illustrate certain embodiments of the invention, and together with the detailed description serve to explain the principles of the present invention.

It will be apparent to those skilled in the art that various modifications and variations can be made in the construction, configuration, and/or operation of the present invention without departing from the scope or spirit of the invention. For example, in the embodiments mentioned above, various changes may be made to any component or method without departing from the scope and spirit of the invention. Further, it may be appropriate to make additional modifications or changes to the OLED structure without departing from the scope of the invention. Thus, it is intended that the present invention cover the modifications and variations of the invention provided they come within the scope of the appended claims and their equivalents.

What is claimed is:

1. A method of reducing the internal reflection of light in an OLED device, comprising the steps of:

providing an OLED device, wherein the OLED device comprises a transparent substrate and a color changing media film; and printing at least one photoresist pattern on at least one side of the transparent substrate, wherein said step of printing the at least one photoresist pattern on at least one side of the transparent substrate comprises the step of using a laser interference lithograph to print the at least one side of the transparent substrate.

2. The method of reducing the internal reflection of light in an OLED according to claim 1, wherein said step of printing the at least one photoresist pattern on the at least one side of the transparent substrate further comprises printing at least one high resolution, high density photoresist pattern on at least one side of the said transparent substrate.

3. The method of reducing the internal reflection of light in an OLED according to claim 2, wherein said step of printing at least one high resolution, high density photoresist pattern on at least one side of the said transparent substrate further comprises printing at least one highly uniform photoresist pattern on at least one side of the said transparent substrate.

4. The method of reducing the internal reflection of light in the OLED according to claim 1, further comprising the step of transferring the at least one photoresist pattern on at least one side of the transparent substrate to an another layer.

5. The method of reducing the internal reflection of light in the OLED according to claim 4, wherein said step of transferring that at least one photoresist pattern on at lease one side of said transparent substrate to another layer comprises transferring the at least one photoresist pattern on at least one side of the transparent substrate to an oxide layer.

6. An OLED device having a reduced amount of internal reflected light, which comprises:

an OLED device, wherein the OLED device comprises a transparent substrate and a color changing media film, wherein said transparent substrate comprises at least one photoresist pattern printed on at least one side of said transparent substrate,
wherein said at least one photoresist pattern printed on at least one side of the said transparent substrate is printed using a laser interference lithography.

7. The OLED device having a reduced amount of internal reflected light according to claim 6, wherein said at least one photoresist pattern printed on at least one side of said transparent substrate comprises at least one high resolution, high density photoresist pattern printed on at least one side of said transparent substrate.

8. The OLED device having a reduced amount of internal reflected light according to claim 7, wherein said at least one high resolution, high density photoresist pattern printed on at least one side of said transparent substrate comprises at least one highly uniform photoresist pattern.

9. The OLED device having a reduced amount of internal reflected light according to claim 6, wherein said at least one photoresist pattern printed on at least one side of said transparent substrate is transferred to an another layer.

10. The OLED device having a reduced amount of internal reflected light according to claim 9, wherein said another layer is an oxide layer.

* * * * *